United States Patent [19]
Laidig

[11] Patent Number: 5,887,155
[45] Date of Patent: Mar. 23, 1999

[54] VERTEX BASED GEOMETRY ENGINE SYSTEM FOR USE IN INTEGRATED CIRCUIT DESIGN

[75] Inventor: Thomas Laidig, Richmond, Calif.

[73] Assignee: Microunity Systems Engineering, Inc., Sunnyvale, Calif.

[21] Appl. No.: 687,043

[22] Filed: Jul. 25, 1996

[51] Int. Cl.$^6$ .................................................. G06F 17/50
[52] U.S. Cl. .......................................................... 395/500
[58] Field of Search .................... 395/500; 364/488–491, 364/578

[56] References Cited

U.S. PATENT DOCUMENTS

| | | | |
|---|---|---|---|
| 4,829,446 | 5/1989 | Draney | 364/48 |
| 5,381,343 | 1/1995 | Bamji et al. | 364/488 |
| 5,432,714 | 7/1995 | Chung et al. | 364/525 |
| 5,440,720 | 8/1995 | Baisuck et al. | |
| 5,553,273 | 9/1996 | Liebmann | |
| 5,553,274 | 9/1996 | Liebmann | 395/500 |
| 5,581,474 | 12/1996 | Bamji et al. | |
| 5,661,663 | 8/1997 | Scepanouic et al. | 364/490 |
| 5,663,893 | 9/1997 | Wampler et al. | 364/491 |

Primary Examiner—Kevin J. Teska
Assistant Examiner—Ayni Mohamed
Attorney, Agent, or Firm—Burns, Doane, Swecker & Mathis, L.L.P.

[57] ABSTRACT

A system and method for processing geometry is provided which reduces the amount of memory needed for processing the geometry while improving the processing speed. The system and method deliver vertices in sequence to a vertex queue so that data in the vertex queue is freed as it is delivered and only minimal intermediate results are stored. By this incremental evaluation, less memory space is needed because input data is freed as it is used to compute results so that only small portions of intermediate results exist at any time. In another aspect of the present system and method, the vertices are maintained in the proper sequence so that sorting operations can be eliminated. More particularly, a sorted vertex queue and an unsorted vertex list are utilized so that resorting of the entire vertex list may be prevented. The use of sorted vertex queue and unsorted vertex lists are particularly useful when reading or collecting input data by allowing data to be efficiently stored and managed. In addition, a compressed format for storing geometry is utilized based on the fact that much information can be rederived from a sorted and reduced vertex queue.

24 Claims, 9 Drawing Sheets

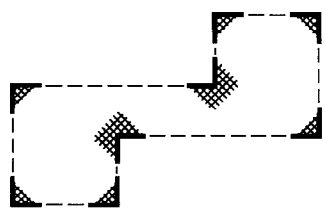
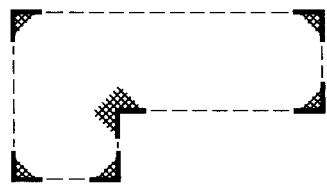
FIG. 3(e)  FIG. 3(f)
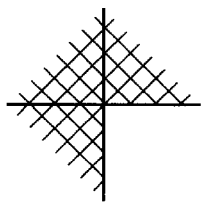 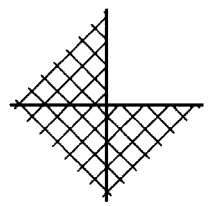 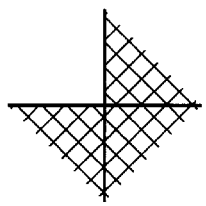 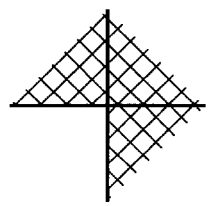
FIG. 4(a)  FIG. 4(b)  FIG. 4(c)  FIG. 4(d)
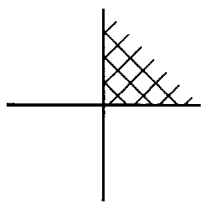 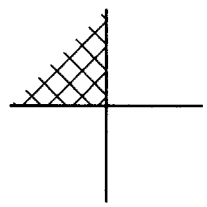 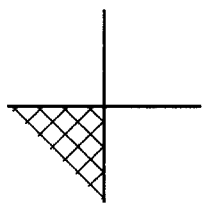 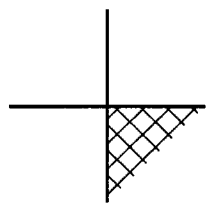
FIG. 4(e)  FIG. 4(f)  FIG. 4(g)  FIG. 4(h)
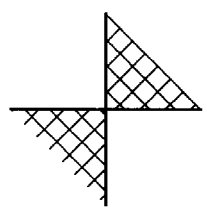 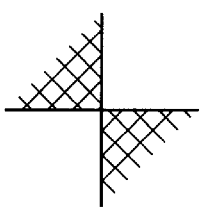
FIG. 4(i)  FIG. 4(j)

VERTEX BASED GEOMETRY ENGINE SYSTEM FOR USE IN INTEGRATED CIRCUIT DESIGN

FIELD OF THE INVENTION

The present invention is directed to a vertex based geometry engine system for use in integrated circuit design. More particularly, the present invention is directed to a system for processing integrated circuit design geometry which uses less storage by performing incremental evaluation of the input data and avoiding memory intensive operations, which also improves the speed of the geometry engine system.

BACKGROUND OF THE INVENTION

A geometry engine is generally defined as a set of basic routines for processing integrated circuit geometry, and examples of some basic routines include Boolean operations (And, Or, AndNot), sizing operations (Grow and Shrink), and transformation operations (Translation, Rotation, and Mirroring). The geometry engine is particularly suited to VLSI design for checking design rules and fracturing the integrated circuit layout.

Some examples of Boolean operations that may be performed by a geometry engine on two geometric areas (A and B) are illustrated in FIGS. 1(a)–1(c). In FIG. 1(a), an And operation is performed on the two geometric regions A and B and the resulting region from this operation is outlined by the thick line. An Or operation is performed on the two geometric regions A and B in FIG. 1(b) with the region resulting from this operation being outlined by the thick line. In FIG. 1(c), an A AndNot B operation is performed on the two geometric regions A and B with the resulting region contained within the thick line.

Some examples of sizing operations that may be performed by geometry engines are illustrated in FIGS. 2(a) and 2(b). In FIG. 2(a), a Grow operation by an amount $\Delta$ is performed on the shaded geometric regions so that all of the edges are moved outward by the fixed amount $\Delta$ to achieve the geometric region outlined by the thick line. In FIG. 2(b), a Shrink operation is performed on the shaded geometric regions so that all of the edges are moved in by the fixed amount $\Delta$ to produce the geometric regions outlined by the thick line. The Grow and Shrink operations are often used in design rule checking for the integrated circuit design to determine whether two or more geometric regions are properly spaced within the design rules.

Geometry engine systems having representations of various bases are known and include geometric based representations by contiguous polygons as illustrated in FIGS. 3(a) and 3(b), geometric based representations by non-overlapping quadrilaterals (rectangles or trapezoids) as illustrated in FIGS. 3(c) and 3(d) and geometric based representations by vertices as illustrated in FIGS. 3(e) and 3(f). While these known representations have been used in integrated circuit design with success, drawbacks and problems are associated with each representation. For example, geometric based representations by contiguous polygons create memory and speed problems because awkward representations typically result which are cumbersome to manipulate. The geometric based representations by non-overlapping quadrilaterals introduce false edges where non-overlapping quadrilaterals are joined together which also generate awkward representations. The known geometric based representations by vertices create problems due to large memory requirements and generally slow processing speeds. Although a potential problem of geometric based representations by vertices is that these representations are not well suited to arbitrary-angle geometries, this does not present a problem in many integrated circuit design applications because integrated circuit designers typically design at right angles to avoid arbitrary angle geometries which simplifies the design and optimizes some photolithography processes.

Of these known representations, the vertex based representation systems generally provide the most advantages for integrated circuit design applications. One such advantage provided by vertex based representations is that simple and consistent data types may be used. For instance, 16 possible data combinations in each quadrant for a vertex may be reduced to 10 possible data combinations for analysis purposes. These 10 possible combinations are illustrated in FIGS. 4(a)–4(j) and include the four concave placements of data at a vertex (FIGS. 4(a)–4(d)), the four convex placements of data at a vertex (FIGS. 4(e)–4(h)), and the two opposed data placements at a vertex (FIGS. 4(i) and 4(j)) which are termed complex placements. Another advantage of the vertex based representation is that no false features of the geometry are generated. An absence of false features allows less memory and processing time to be used as compared to the geometric based representation by quadrilaterals which generates extra construction lines for edges that do not exist. As a result, less processing time and memory space is needed for performing basic routines with vertex representations by avoiding such construction lines. Processing by vertex based representations also generates straightforward inter-geometry interactions so that less processing time of basic routines is necessary in comparison to polygon based representations where complex and multiple figures are used which leads to complex geometric interactions. Vertex based representations also allow routines and operations to be easily performed at the corner represented by the vertex.

Nevertheless, known vertex based representation systems are disadvantageous in certain aspects of integrated circuit design applications. Even though the vertex based representation systems are poorly suited to arbitrary angle geometries this is generally not a great concern in integrated circuit design because the industry generally trends towards right angle designs to provide the best photolithographic resolution between horizontal and vertical edges for certain photolithography processes and simplicity because most geometry is machine-generated. Thereby, the main disadvantage in the known vertex based representation systems are speed and size deficiencies. In other words, the known vertex based representation systems use a large amount of memory for intermediate results and unnecessary processing which lead to systems functioning at slow speeds due to the memory manipulation.

One example of a known vertex based geometry engine system is called the "fang" system and was developed in the mid-1980s by Peter Moore at the University of California—Berkeley, no publications of this system are known except for source code and pseudo code developed therefrom. Due to this lack of published documents, a general description of the fang system will follow. FIG. 5 illustrates some examples of fang data structures. The fang data structure includes a fang geometry data structure 520 which includes "sorted" and "reduced" flag bits 522 and 524. Even though the term "merged" is typically used in fang, the term "reduced" is used instead of merged herein, for term consistency. The sorted flag bits 522 indicate whether a vertex list 526 of the vertices is sorted and the reduced flag bit 524 indicate whether the geometry vertices are reduced (whether there are no self-overlaps of geometry).

The example of FIG. 5 illustrates two vertices 530 and 540 in a linked vertex list. The fields for the vertices 530 and 540 include next pointers 532 and 542, which point to the succeeding entry in the linked list, vertex type fields 534 and 544, and x and y values 536, 538 and 546, 548. In the fang system, vertex sorting is performed in a scan line order from left to right and bottom to top. When a new geometry figure is added by reading or collecting the additional geometry, vertices may become out of order because the new vertices are simply appended to the vertex list. Also, when operations such as growing, mirroring, or rotating are performed, the vertices move in different directions which may cause the vertices in the vertex list 526 to become out of order. Accordingly, the vertex list 526 is sorted automatically by the fang system when needed to ensure that the vertices do not become out of order. In the fang system, the vertex list 526 is sorted very frequently and, since the number of operations required in each sort can be expressed as being of order n $\log_2$ n, or "O(n $\log_2$ n)", wherein n is the number of vertices in the list, these operations may use a substantial amount of time.

An important operation in the fang system is reduction. A short description of geometry "depth" will follow as background for the reduction operation. Generally, the geometry depth is the number of overlapping pieces of geometry at a particular point. For instance, a geometry depth of zero indicates that there is a space between geometric figures and no geometry exists at that point. A geometry depth of one indicates that a geometry figure exists at that point and, in general, the value of the geometry depth corresponds to the number of figures overlapping at a point. The geometry depth concept is used in the reduction operation by the fact that a geometry is reduced when the geometry depth is either zero or one throughout the geometry. A geometry will typically be left unreduced after a new geometric figure has been added which overlaps the existing geometry. Therefore, when a new geometric figure is added, the fang system assumes that overlaps have occurred and clears the reduced flag. Similarly, for Grow and Or operations, two geometric figures may overlap and to ensure that the geometry will be reduced, the fang system clears the reduced flag. When an operation requiring reduced geometry is performed, the reduced flag is analyzed and a reduction operation is performed if the reduced flag is not set.

The reduction method of the fang system will be discussed in more detail with reference to FIG. 6. In the fang system, vertices are examined in a scan line order and a temporary list of vertical edges cutting the current scan line is created and maintained during the reduction operation. In the reduction method of the fang system, points are analyzed where a vertex exists in the input geometry or a vertical edge intersects a scan line containing an input vertex. These are the points labeled a–j in FIG. 6. At each of these analyzed points, the geometry depth to the left of the analyzed point (above and below) is known, the vertex (if present) adds offset to the geometry depth to the above-right of the point, and the edge (if present) adds offset to the geometry depths to the right (both above and below) the point. As a result, an output vertex is produced depending on the geometry depth in each quadrant and the edge is added or removed based on the geometry depth Δ above the point (the depth difference between the regions to the upper right and upper left).

A discussion for one example of this reduction method follows for the points a–j of FIG. 6. At point a, a left edge is added to the edge list and an output vertex is created; at point b, a right edge is added to the edge list and an output vertex is created; at point c, a left edge is noticed and no action is performed; at point d, a left edge is added to the edge list and no output vertex is created; at point e, a right edge is noticed and an output vertex is created; at point f, a right edge is added to the edge list and an output vertex is created; at point g, a left edge is removed from the edge list and an output vertex is created; at point h, a left edge is removed from the edge list and no output vertex is created; at point i, a right edge is removed from the edge list and no output vertex is created; and at point j, a right edge is removed from the edge list and an output vertex is created. By these actions, the geometry illustrated in FIG. 6 is reduced to a geometry depth of zero or one throughout. In the fang system, the geometry is frequently reduced and unnecessary reduction operations may be performed which slows the speed of the system. For example, the fang system may unnecessarily reduce the result of an And operation which feeds another And operation. In the worst case, each reduction takes $O(n^2)$ time but in practice, the number of operations is closer to being linear, O(n).

In known vertex based geometry systems, the memory size necessary to process the geometry is generally considered to be the biggest problem. In the fang system for instance, 16 or 20 bytes of data are used to represent each vertex, which requires a large amount of memory. Fang also requires the memory to be simultaneously used for the complete source data and result of each operation, which leads to a large amount of memory being used. Accordingly, the present invention is primarily directed to reducing the amount of memory necessary for performing the routines. Secondarily, and as a by-product of reducing the memory size, the present invention is also directed to increasing the speed for performing these routines.

SUMMARY OF THE INVENTION

The present invention is directed to a system and method for processing geometry which reduces the amount of memory needed for processing the geometry while improving the processing speed. In one aspect of the present invention, the system and method deliver vertices in sequence to a vertex queue so that data in the vertex queue is freed as it is delivered and only minimal intermediate results are stored. By this incremental evaluation, the producer of an intermediate result generates data as the consumer is freeing it. Thus, less memory space is needed because only small portions of intermediate results exist at any time.

In another aspect of the present invention, the system and method maintain the vertices in the proper sequence so that sorting operations can be eliminated. More particularly, a sorted vertex queue and an unsorted vertex list are utilized so that resorting of the entire vertex list may be prevented. The use of the sorted vertex queue and the unsorted vertex list are particularly useful when reading or collecting input data. During such data collection, the unsorted vertex list receives data until a predetermined amount of data is reached, the data present in the unsorted vertex list is sorted and then stored in the sorted vertex queue. Thereafter, data may continue to be collected and read into the unsorted vertex list. This use of the sorted vertex queue and the unsorted vertex list allows for data to be efficiently stored and managed between the sorted vertex queue and the unsorted vertex list. Also, a sorted (and reduced) vertex queue can be stored in compact form which reduces the amount of space necessary for storage.

BRIEF DESCRIPTION OF THE DRAWINGS

The present invention will become more fully understood from the detailed description given hereinbelow and the accompanying drawings which are given by way of illustration only, and thus are not limitative of the present invention, wherein:

FIGS. 3(a)–3(f) illustrate examples for different representations of geometries;

FIGS. 4(a)–4(j) illustrate possible data combinations for a rectilinear vertex;

DETAILED DESCRIPTION OF THE INVENTION

The embodiments of the present invention are directed to a system which utilizes a geometry engine having a vertex based representation to improve space and speed characteristics as compared to known vertex based representation systems. To facilitate an understanding of the present invention, a description hereinafter will follow with reference to an exemplary implementation. It will be appreciated, however, that the principles of the present invention are not limited to this specific embodiment. Rather, the invention is applicable to any type of computer or system in which it is desirable to use a vertex based representation for geometry. While the particular hardware components of the computer system do not form part of the invention itself, they are briefly described herein to provide a thorough understanding of the manner in which the features of the present invention cooperate with the hardware of the computer system to produce the processes and operations.

Figure 7:
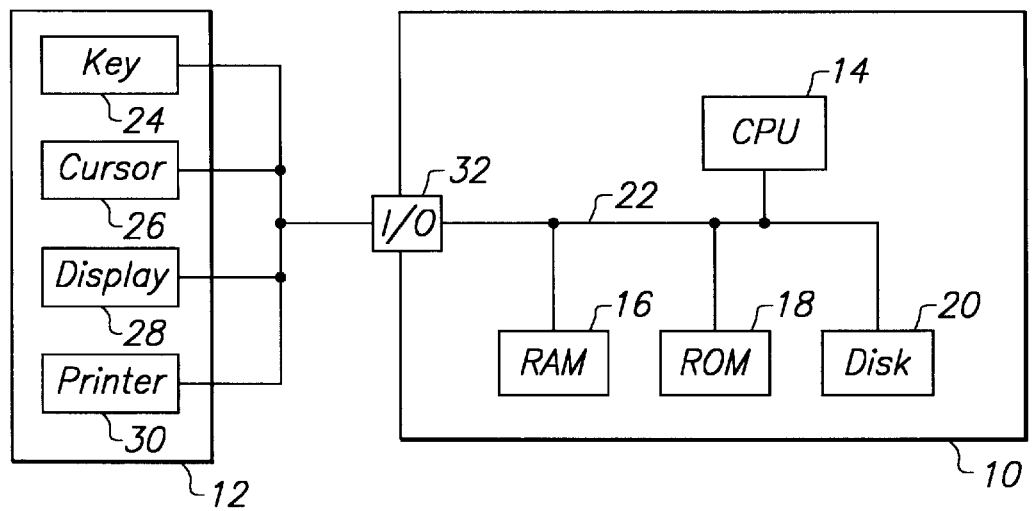
FIG. 7 illustrates a system for the vertex based geometry engine according to an embodiment of the present invention.

Referring to FIG. 7, an exemplary computer system that can be used in an embodiment of the present invention includes a computer 10 having a variety of external peripheral devices 12 connected thereto. The computer 10 includes a central processing unit (CPU) 14 and associated memory. The associated memory generally includes a main memory which is typically implemented in the form of a RAM 16, a static memory such as a ROM 18, and a permanent storage device such as a magnetic or optical 20, for example. The CPU 14 communicates with the memory through an internal bus 22 and with the external peripheral devices 12 by one or more input/output ports 32. The peripheral devices 12 include a data entry device such as a keyboard 24 and a pointing or cursor control device 26, such as a mouse, trackball, pen or the like. A display device 28, such as a CRT monitor or an LCD screen is also included in the external peripheral devices 12 for providing a visual display of the invention that is being processed within the computer 10. A hard copy of the processed information can be provided through a printer 30, or another similar device which is also included in the external peripheral device 12.

Figure 1A:
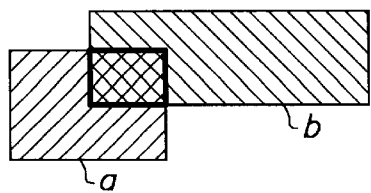
FIGS. 1(a)–(c) illustrate examples of Boolean operations performed on geometries.
Figure 1B:
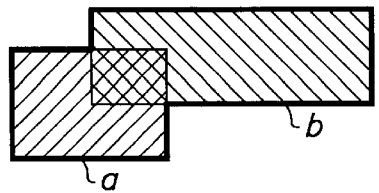
Figure 1C:
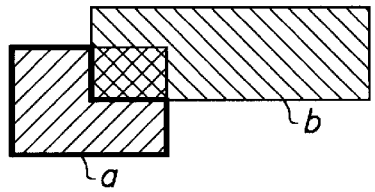
Figure 2A:
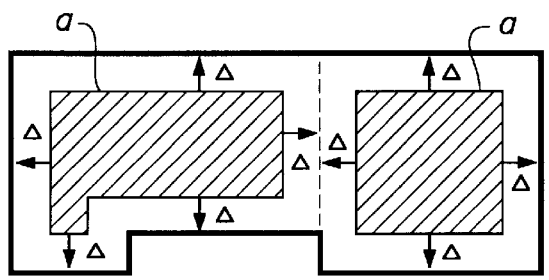
FIGS. 2(a) and 2(b) illustrate examples of Grow and Shrink processes performed on geometries.
Figure 2B:
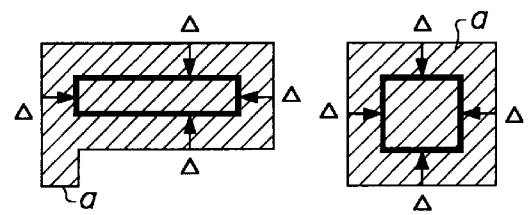
Figure 3A:
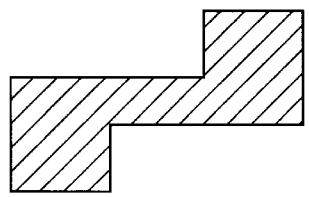
Figure 3B:
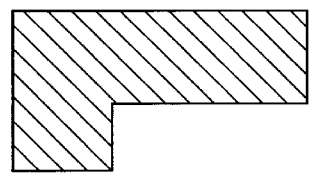
Figure 3C:
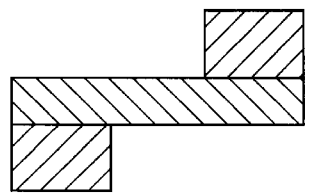
Figure 3D:
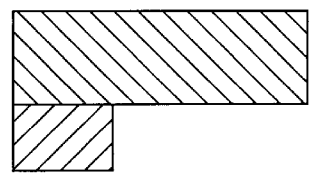
Figure 5:
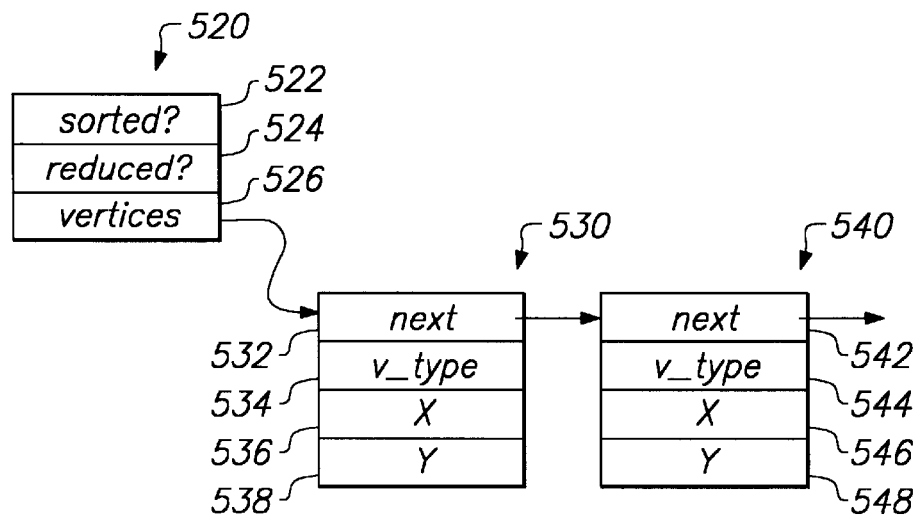
FIG. 5 illustrates a data structure for a known vertex based representation geometry engine system.
Figure 6:
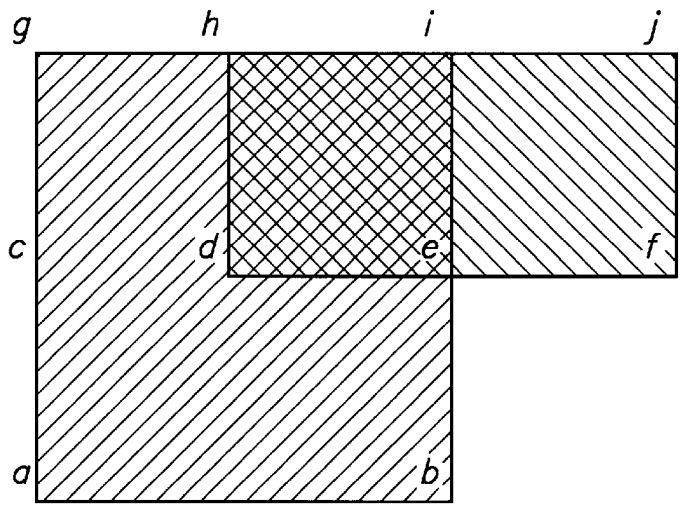
FIG. 6 illustrates points to be examined on a geometry to be reduced in the known vertex based system.
Figure 8A:
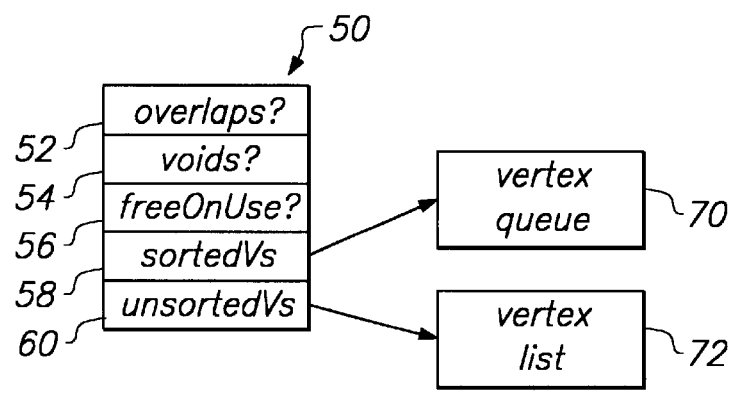
FIG. 8(a) illustrates a data structure which may be used for the vertex based geometry engine system according to one embodiment of the present invention.

The system which utilizes the vertex based representation for geometry according to an embodiment of the present invention has basic data structures as illustrated in FIG. 8(a), for example, so that incremental evaluation of input data may be performed. The example of the basic data structure 50 illustrated in FIG. 8(a) includes an overlap flag bit 52, a voids flag bit 54, and a free-on-use flag bit 56. The overlap flag bit 52 indicates whether the geometry to be processed has or may have any self overlaps (i.e., places where the geometry depth is greater than one). The voids flag bit 54 indicates whether the geometry has or may have voids (i.e., places where the geometry depth is less than zero). The free-on-use flag bit 56 indicates whether the geometry should be freed as it is used (i.e., whether to maintain or delete the geometry). The data structure 50 also includes a pointer 58 to a sorted vertex queue 70 and a pointer 60 to an unsorted vertex list 72.

The sorted vertex queue 70 and the unsorted vertex list 72 contain the field depth of the geometry. In the data structure 50 of the present invention, the depth of the geometry at infinity is typically zero or one (but may have any value), as opposed to the fang system where the depth of the geometry at infinity is zero by definition, so that a true inverse geometry may be represented by the present invention.

The sorted vertex queue 70 and the unsorted vertex list 72 also include a small cache of vertices in a linked list (similar to the vertex list of the fang system). The sorted vertex queue 70 further contains a pointer to a refill function, which is called when a vertex cache is empty, and a pointer to whatever data the refill function needs.

Figure 8B:
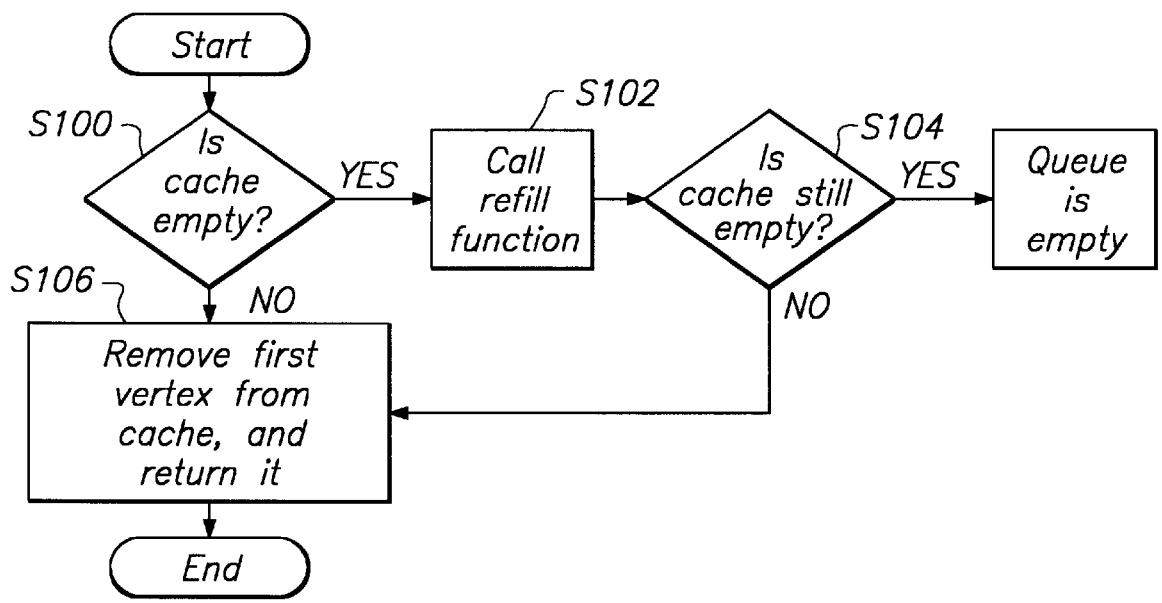
FIG. 8(b) is a flow chart for extracting a vertex from a queue for an embodiment of the present invention.

In use, a standard procedure is provided to get a next vertex from a queue as illustrated for example in the flow chart of FIG. 8(b) for extracting a vertex from a queue. In FIG. 8(b), it is determined whether a vertex cache is empty at step S100. If the vertex cache is empty, a refill function is called at step S102. Next, at step S104, it is again determined whether the vertex cache is still empty. If the vertex cache is still empty, this process is completed. However, if it is determined at either step S100 or step S104 that the vertex cache is not empty, the first vertex from the vertex cache is removed and returned at step S106 before completing this process.

The refill function normally places a small group of vertices into the vertex cache when this function is called. Thereby, the overhead time of calling the refill function is reduced since the refill function is called only once for every group of vertices. The exact size of this vertex group may vary but the size of the vertex group is intended to place a small number of vertices in the vertex cache so that the memory needed by the vertex cache is small. For example, in refill functions that are doing scan-line processing (such as unpacking and reducing processes), one scan line is typically processed per call and the number of vertices placed into the vertex cache at a time is determined therefrom.

In one embodiment of the present invention, the unsorted vertex list 72 may be implemented using the same data structure as used for the sorted vertex queue 70, but with a "refill function" that never refills the vertex cache. Thus, the vertex cache contains the entirety of the vertex list.

The data structure allows vertices to be delivered in sequence by the sorted vertex queue 70 so that the data in the sorted vertex queue 70 may be freed as the data is delivered. This allows data to be incrementally evaluated by freeing the input data as it is used to compute results. Thereby, only small parts of intermediate results exist at any given time, and the amount of needed memory space for processing data may be reduced.

The refill function and its associated data have been described generically so an application of a specific embodiment will follow for clarity. When merging blocks of data, the refill function may peel vertices out of two queues and deliver the vertices in the proper order for outputting. The data structure used in this embodiment contains pointers to two input queues and a pointer to the vertex just removed from each input queue. The refill function must be able to remove vertices for comparison and then return one while the other is saved for future reference.

Figure 8C:
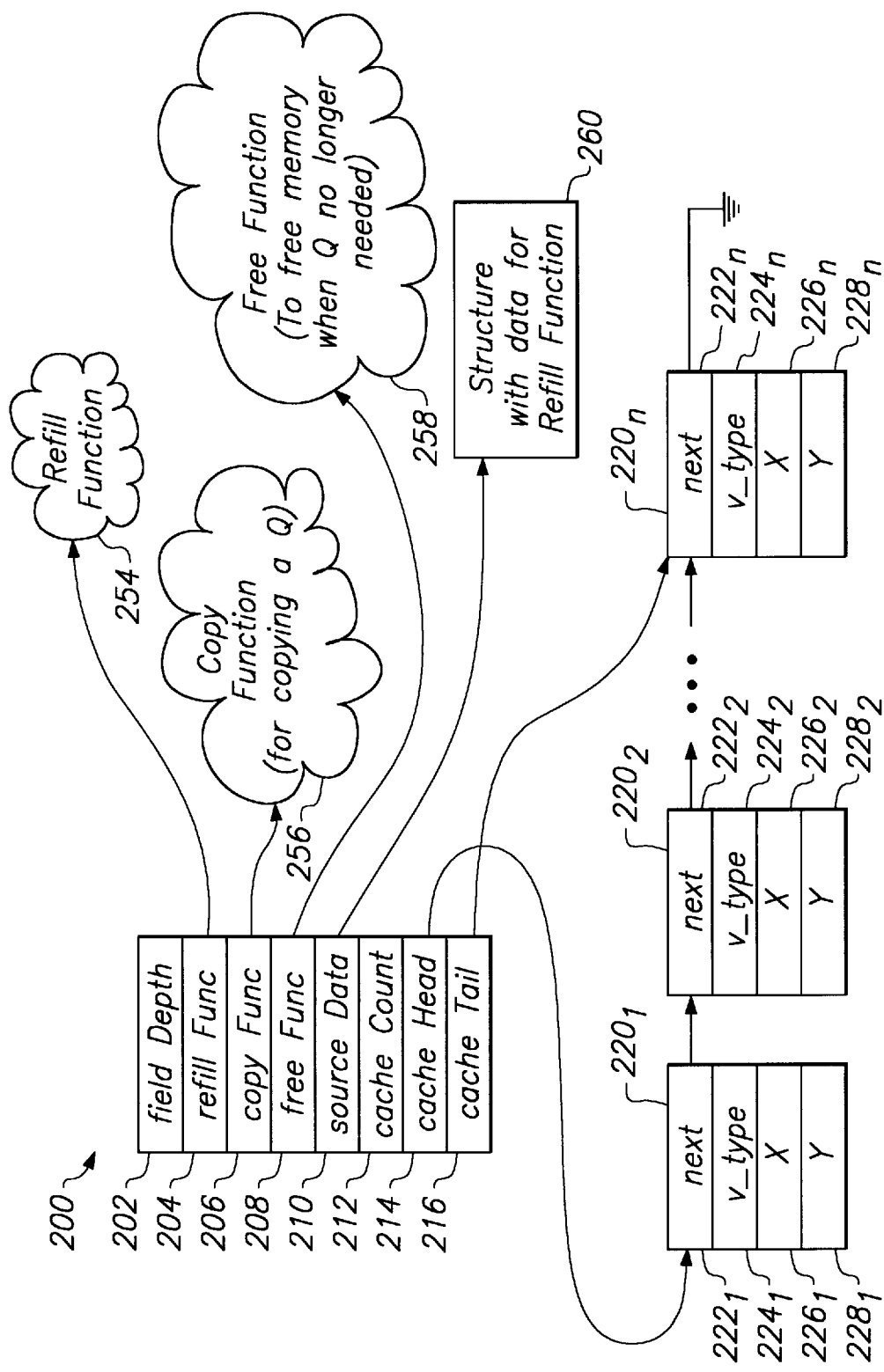
FIG. 8(c) illustrates a queue data structure according to one embodiment of the present invention.

FIG. 8(c) illustrates the data structure that may be used in an embodiment of the present invention for a queue itself. The queue data structure 200 includes field depth data 202, representing the depth at infinity, a refill function pointer 204 associated with a refill function 254, a copy function pointer 206 associated with a copy function 256, a free function pointer 208 associated with a freeing function 258, a source data pointer 210 associated with a structure 260 having data for the refill function 254, cache count data 212, representing the number of vertices in the cache, a cache head pointer 214, and a cache tail pointer 216. The form of the structure 260 will vary depending on the refill function 254. The cache head pointer 214 points to the beginning of a linked list of caches $220_1, 220_2, \ldots 220_n$ and the cache tail pointer 216 points to the end of the linked list of caches. Each cached vertex includes a next pointer $222_1, 222_2, \ldots 222_n$, a vertex type field $224_1, 224_2, \ldots 224_n$, and x and y fields $226_1, 226_2, \ldots 226_n$ and $228_1, 228_2, \ldots 228_n$ where the last next pointer in the cache list is a null pointer as represented by the ground symbol.

Figure 8D:
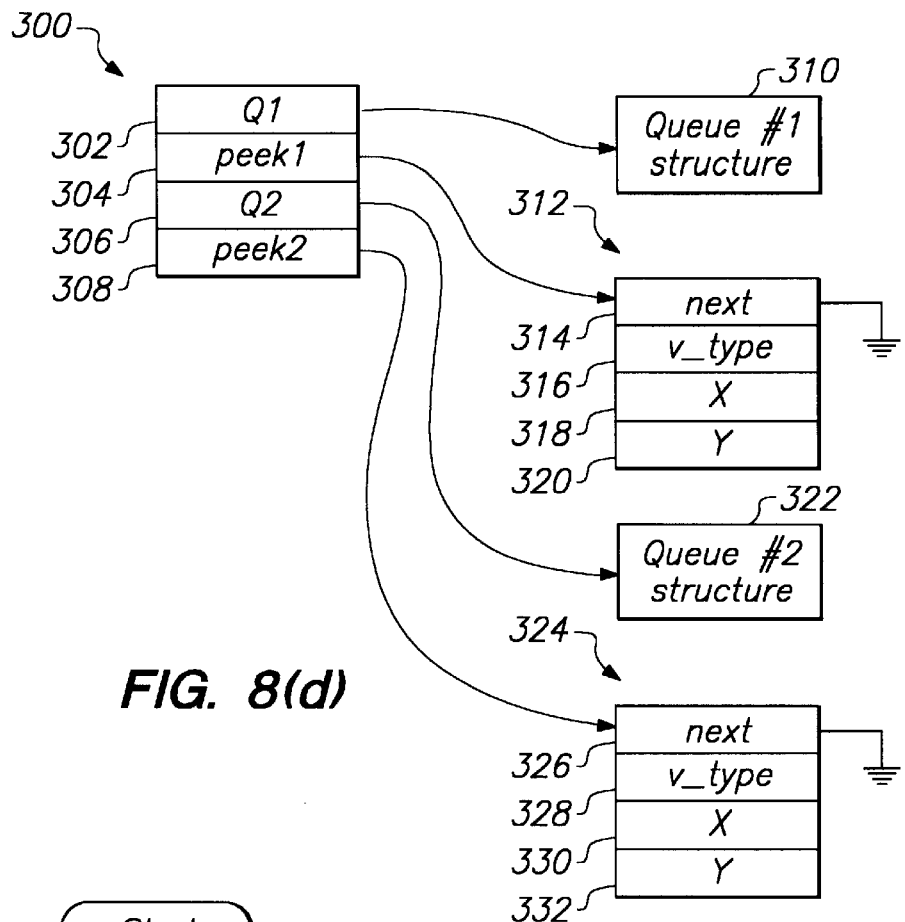
FIG. 8(d) illustrates a merger's source data structure for an embodiment of the present invention.
Figure 8F:
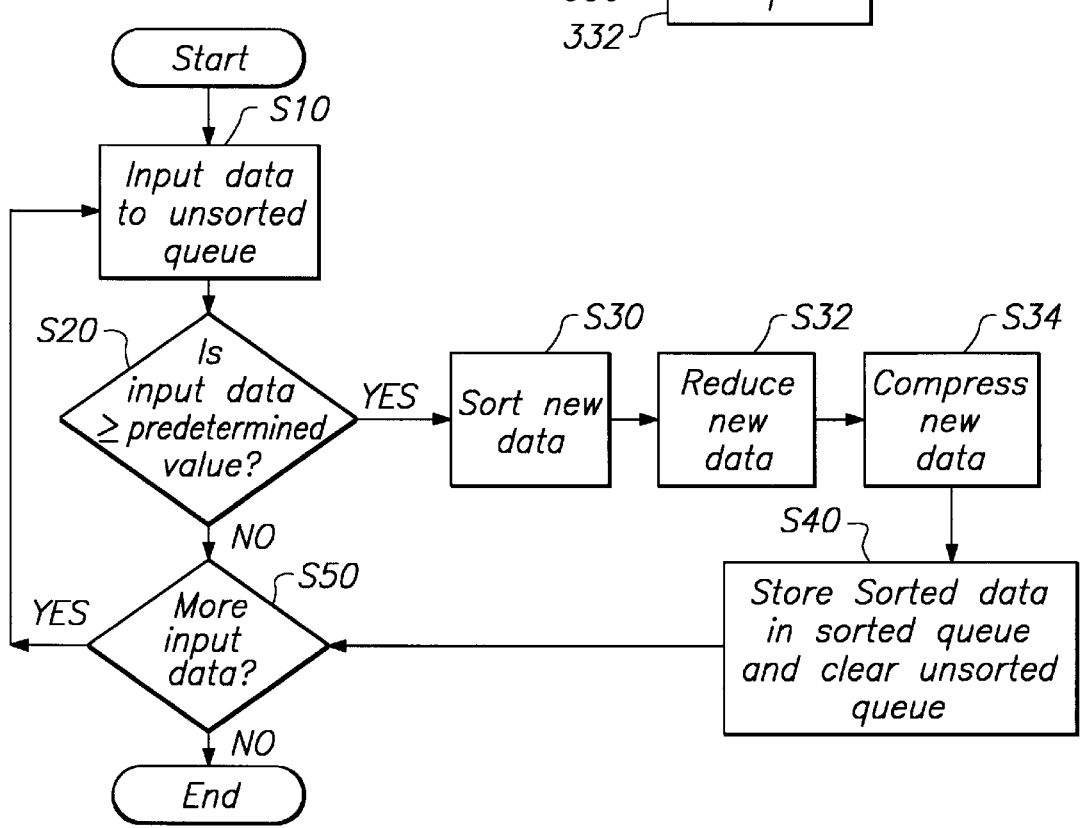
FIG. 8(f) illustrates a flow chart for delivering and processing input data to the system.
Figure 8E:
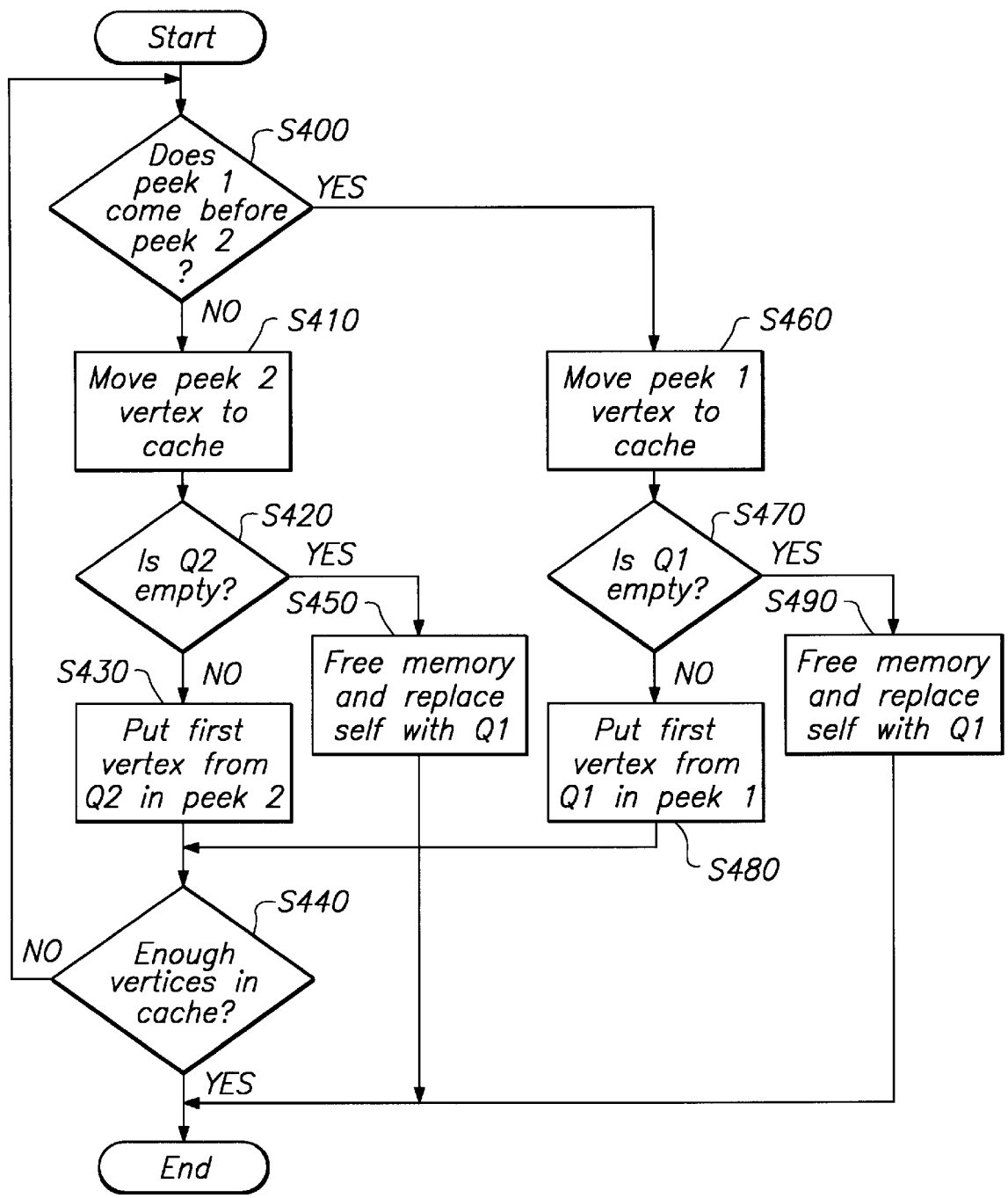
FIG. 8(e) is a flow chart for a merger's refill function according to one embodiment of the present invention.

FIGS. 8(d) and 8(e) illustrate the structure for source data in a merger and a flow chart for the merger's refill operation, respectively. In FIG. 8(d), the structure 300 for source data includes a first queue pointer 302, a first queue peek pointer 304, a second queue pointer 306 and a second peek pointer 308. The first queue pointer 302 points to the first data queue 310 and the first queue peek pointer 304 points to the first vertex data 312 from the first queue data structure 310. The first vertex data 312 includes a next data pointer 314, vertex type data 316 and x and y data 318 and 320. The second queue pointer 306 points to the second data queue 322 and the second queue peek pointer 308 points to second vertex data 324. The second vertex data 324 includes a next data pointer 326, vertex type data 328 and x and y data 330 and 332.

The merger refill function for an embodiment of the present invention as shown in FIG. 8(e) will be described for the source data structure of FIG. 8(d). At step S400, it is determined whether the vertex data for the first peek pointer comes before the vertex data for the second peek pointer. If the first peek pointer does not come before the second peek pointer, the vertex data associated with the second peek pointer is moved to the vertex cache at step S410. Next, it is determined whether the second queue is empty at step S420. If the second queue is empty, the memory is freed and replaced with the first data queue at step S450 and then the process is completed. If the second data queue is determined not to be empty at step S420, the first vertex data from the second data queue is placed in the second peek pointer at step S430. Next, it is determined whether there are enough vertices in the cache at step S440. If there are not enough vertices in the cache, the process returns to step S400, but if there are enough vertices in the cache, the process is completed.

Returning to step S400, if the vertex data for the first peek pointer does come before the vertex data for the second peek pointer, the vertex data associated with the first peek pointer is moved to the cache at step S460. Next, it is determined whether the first queue is empty at step S470. If the first queue is empty, the memory is freed and replaced with the second data queue at step S490 and then the process is completed. If the first data queue is determined not to be empty at step S470, the first vertex data from the first data queue is placed in the first peek pointer at step S480. The process then proceeds to step S440 for determining whether there are enough vertices in the cache.

The use of the sorted vertex queue 70 and the unsorted vertex list 72 also allows large amounts of input data to be read into the system. In the known fang system, the amount of input data that may be read into the system is limited by an unsorted input list. When the fang system receives input data, unsorted input data is stored directly in the single unsorted vertex list and the amount of input data that can be received is dependent upon the size of the single unsorted vertex list. If the amount of input data exceeds the storage of the processing system, the fang system will abort without processing any of the input data.

In one embodiment of the present invention, the sorted vertex queue and unsorted vertex list are utilized to address this limitation of the fang system. In this embodiment of the present invention, input data is delivered directly to the unsorted vertex list 72 and the system determines when the input data reaches or exceeds a predetermined maximum size of the unsorted vertex list 72. If the input data reaches or exceeds this predetermined amount, the data read into the unsorted vertex list 72 is sorted, converted into a compressed form, and then stored in the sorted vertex queue 70 upon this detection so that the unsorted vertex list 72 is cleared and made ready to receive additional input data. Since the sorted vertex queue can be stored more compactly then an unsorted list, the system is able to read large amounts of input data which exceed the memory space available in the unsorted vertex list 72.

One example of this embodiment is illustrated in FIG. 8(f) where the input data is read into the unsorted vertex list 72 before sorting and transferring the input data to the sorted vertex queue 70 when the amount of input data reaches or exceeds a predetermined amount of available memory space. An example of process steps for performing this determination is illustrated in FIG. 8(f). At step S10, data is input to the unsorted vertex list 72. The system then determines whether the data input to the unsorted vertex list 72 reaches or exceeds the predetermined amount at step S520 which is indicative of the amount of space available for storing input data in the unsorted vertex list 72. If the input data reaches or exceeds this predetermined amount, all of the new data in the unsorted vertex list 72 is sorted at step S30. To merge the new data into the sorted vertex queue 70, the new data is reduced at step S32, compressed at step S34 and then stored in the sorted vertex queue 70 at step S40. The unsorted vertex list 72 is also cleared at step S40 and made available for receiving more input data. Both after step S40 and when the input data is determined not to exceed the predetermined input value at step S20, the process proceeds to step S50 where a determination is made on whether any more input data is available. If more input data is available, the process proceeds to step S10 for inputting more data to the unsorted vertex list 72. Otherwise, if no more input data is available, this processing of input data is completed. The above-described process optimizes space and speed considerations for inputting data to the system.

The separate sorted vertex queue 70 and unsorted vertex list 72 also allow additional geometric figures to be added to the present geometry without resorting the entire vertex list. Because the sorting processes are basic processes frequently performed in vertex based systems, a brief discussion of a typical merge/sort process will be discussed. In the merge sort process, a list merger is the basic element that merges two sorted lists by repeatedly comparing the first elements of each list and then putting whichever element comes first into the output list. More generally, an unsorted list of n items is split into n lists of one item each, but for illustrative purposes, an eight item list will be shown. Pairs of one item lists are merged into half as many two item lists and pairs of two item lists are merged into half as many four item lists. These iterative processes are repeated until the result is stored in one list.

Figure 9:
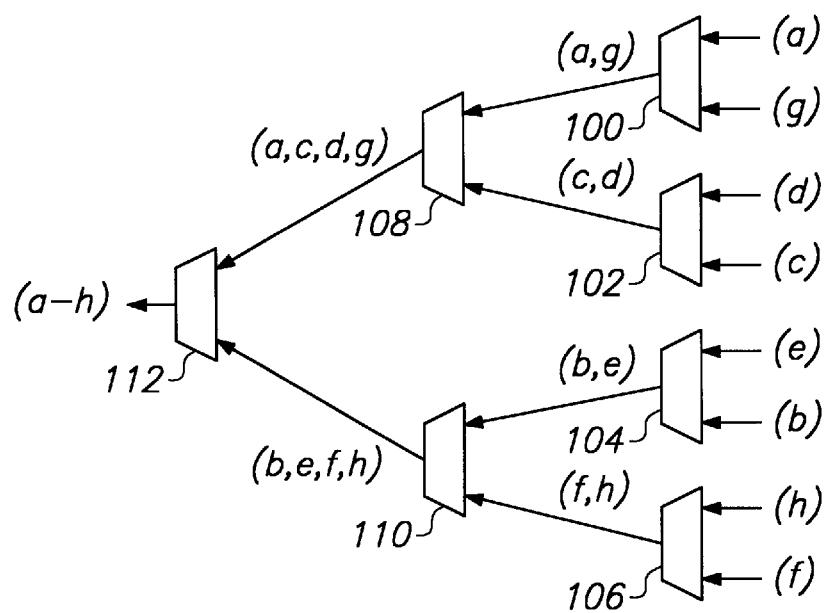
FIG. 9 illustrates an example of a merge/sort process for an eight item list.

FIG. 9 illustrates a merge/sort process for sorting an eight item list. In FIG. 9, the eight item list is represented by (a), (g), (d), (c), (e), (b), (h), and (f). At the first group of steps, merge/sort units 100, 102, 104, and 106 merge the one item list pairs of (a) and (g), (d) and (c), (e) and (b), and (h) and (f). At the next group of steps, merge/sort units 108 and 110 merge the two item list pairs of (a,g) and (c,d), and (b,e) and (f,h). At the final step, merge/sort unit 112 merges the two pairs of four item lists (a, c, d, g) and (b, e, f, h) into one sorted eight item list (a–h). The generalized relation for the number of steps each vertex requires to merge n items into one sorted list is $\log_2 n$ and the total number of necessary steps is $n \log_2 n$. A "step" in this case includes comparing first vertices from sublists along with outputting the vertex that should come first based on this comparison. In the example of FIG. 9 for the eight item list, the number of steps required per item is three steps ($\log_2 8$). To process all eight items with a merge sort process, 24 steps ($8 \log_2 8$) are necessary.

Because sorting is a slow process which reduces the speed of the system, the present invention limits sorting by preventing the vertices from getting out of order as much as possible. In one embodiment of the present invention, a technique for avoiding sorting operations involves determining the scale factor before resorting vertex lists. The general principle of the present embodiment is to prevent scaling from initiating a full resort of the vertices. This is useful in integrated circuit design because scaling operations are frequently performed. More particularly, if the scale factor is greater than one, the vertices in the list will stay in order and, therefore, no resorting operation is performed. However, if the scale factor is less than one, scan lines may merge. Therefore, all vertices with the same scaled Y coordinate are collected and a resort operation is done on the vertices having multiple original scan lines. Since resorting of the vertices is not automatically performed after scaling, unnecessary sorting during scaling processes is avoided in the present embodiment so that the system speed is improved.

Figure 10:
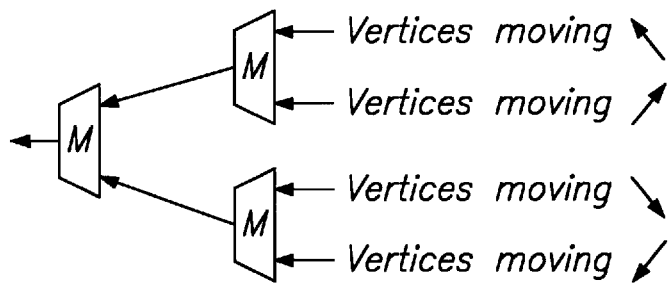
FIG. 10 illustrates a process for minimizing the sorting operation of a vertex based system according to an embodiment of the present invention.

In a still further embodiment of the present invention, truncated merge sort operations are performed after Grow and Shrink operations so that a faster merge sort operation is performed. In contrast, the known fang system performs full merge sort operations which are more time consuming. More particularly, the fang system performs sort operations immediately after Shrink operations since an immediate reduction is necessary which requires a sorted list. After Grow operations, the fang system simply tags the vertex list as being unsorted which then usually requires the vertex list to be resorted before the next operation. In the present invention, however, the full sorting is replaced by a faster truncated merge sort. The technique, which limits sorting after Grow or Shrink operations, is based upon the fact that each vertex may only move in one of four directions (to the upper left, the upper right, the lower right, and the lower left) as illustrated in FIG. 10. In the present embodiment, after categorizing each of the vertices based on the direction that they are moving, a merge/sort operation is performed as the last two steps because the vertices that move in any one of the directions will remain properly sorted. The amount of time taken to resort after Grow and Shrink operations is greatly decreased by this technique. Specifically, the speed of the system is increased by a factor of $$\frac{\log_2 n}{\log_2 4}$$

because the number of steps by a full sort ($n \log_2 n$) is replaced by the number of steps ($n \log_2 4$) for the technique of the present embodiment where n is the number of items to be sorted.

In another embodiment of the present invention, resorting may be avoided during rotation and mirroring operations. For mirroring operations in the X direction, the vertices in each scan line may be accumulated and then reversed. By reversing the X coordinates in the X direction, resorting may be avoided for mirroring operations in the X direction. The unpacker operation (which will be described in detail later) is similar to a reduce function in that vertices are taken in a scan line order, and an edge list is maintained. The same concept of analyzing interesting points as in the fang system is performed. Also, the geometry depth in the upper right quadrant is predicted and the prediction is corrected if the vertex is found in the input data.

However, the unpacker operation is different from the reduce function in that the unpacker operation only handles depths of zero and one and different prediction rules than the reduce function are used. When a compressed form of data stores all four corners identically and explicitly stores the last vertex in each scan line in the same manner as the first vertex, then the unpacker operation may read the byte stream backwards for the mirroring operation in the Y direction. In effect, this operation mirrors in both the Y and X directions. To perform a coordinate interchange operation, rotating by 90° for example, it is necessary to merge the $O(\sqrt{n})$ columns which were the $O(\sqrt{n})$ scan line rows of the unrotated geometry. The number of steps still remains at $O(n \log_2 n)$ where n=the number of items, but less memory is required as compared to a full sort since each column remains in compressed form.

Because the present invention allows both overlaps and voids to be represented, Boolean operation may be performed more efficiently with less memory in a faster amount of time than the presently known vertex based systems. A description for Or and And operations will follow. First, the vertex queue from each geometry operand is accessed. If the unsorted vertex list contains data, the list must be sorted and then merged into the sorted queue. If the geometry is free on use, the geometry structure is freed. If the geometry has voids (for the Or operation) or overlaps (for the And operation), the queue is passed through a reduce function if a reduced flag is not set. Because this reduce function is done before copy operations, any future use of this geometry does not need to be reduced. If the geometry is free on use, the resulting vertex queue is simply used; in use, its memory is freed as vertices are removed therefrom. Otherwise, the queue is copied before being used. After accessing the vertex queue for each geometry operand, the resulting vertex queues from the operands are merged. Thereby, the field depth is the sum of the operand field depths (−1 for the And function) and geometry is considered to exist in the result everywhere that the depth is greater than zero. From the result, a geometry is provided which has overlaps but no voids (for the Or operation) or voids but no overlaps (for the And operation).

Figure 11:
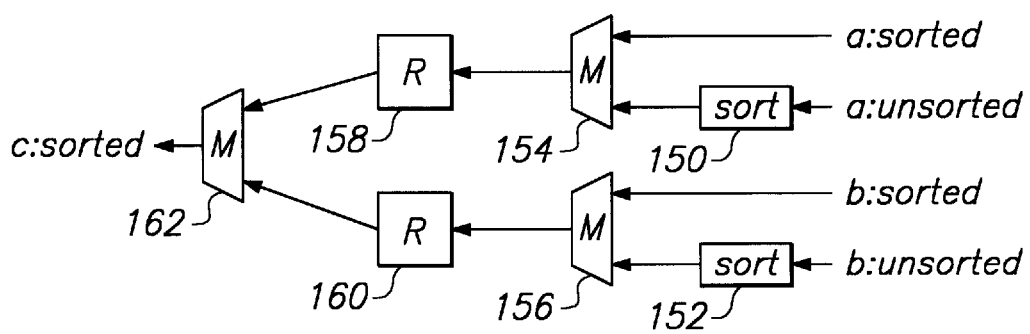
FIG. 11 illustrates one example of a Boolean operation process performed in an embodiment of the present invention.

FIG. 11 illustrates a diagram of a Boolean geometric operation, either C=a Or b or C=a And b. As shown in FIG. 11, the unsorted vertices are inputted to sorting units 150 and 152 before being input to the merging units 154 and 156, respectively. The sorted queues are input directly to the merging units 154 and 156. The outputs of the merging units 154 and 156 are input to reducing units 158 and 160. One or both of these reducing operations may be omitted if the corresponding geometry was already reduced. Next, the outputs of the reducing units 158 and 160 are input to a merging unit 162 which outputs a sorted list of vertices. Each block of data forms a queue whose refill function does a merge or reduce on a small batch of vertices at a time which are pulled from the feeding queues. At this point, only sorting has been performed on the unsorted vertex lists; the other operations have been prepared and will be incrementally executed as the result C is used for its desired purpose.

The present invention also utilizes a compressed format for storing geometry in approximately ¾ bytes/vertex as compared to the fang system which stores geometry in 16 bytes/vertex. The compressed format of the present invention greatly reduces the amount of memory space necessary for storing the geometry. The compressed data form of the present invention is based on the fact that much information can be rederived from a sorted and reduced vertex queue. For a scan line, only the first vertex needs a Y coordinate. Thereby, the data storage is compressed because the storage of repetitive Y coordinates are eliminated. The data is further compressed by only storing the difference of the X value from the previous vertex stored instead of storing each actual X value. Furthermore, storage of the vertex type may be eliminated because at any point the unpacker operation determines from context whether there is geometry in the three quadrants below and to the left of the point.

The unpacker operation then guesses as to whether geometry exists in the upper right quadrant. If a stored vertex is present at the point being considered, the guess was incorrect and should be corrected. Thereby, the vertex type does not need to be stored. Furthermore, the unpacker operation can always correctly guess the upper right corner of the geometry so this corner does not need to be stored which further reduces the amount of data needed to be stored.

There are several possible ways a packer/unpacker combination could be implemented, and the general idea in all cases is that (as with the reduce operation) the unpacker will know at any point what the depths are in the 3 quadrants to the left and below the point. Based on this, the unpacker will make a guess whether the depth in the upper-right quadrant is 0 or 1. If there is a vertex stored in the compressed data, this guess was wrong, so the unpacker knows to pick the other depth. As long as the packer understands how the unpacker will guess, it can arrange to store a vertex when needed and to not store a vertex otherwise.

In principle, the guessing algorithm of the unpacker operation could use any table based on the depths in the three known quadrants. In practice, it is only desirable for the unpacker to make guesses that implied a vertex existed at a point that would be "analyzed" according to the rules for the reduce operation. Otherwise, the unpacker operation would be guessing the existence of vertices all over the place, and the "compressed" form would be extremely large because the packer would have had to store a large number of vertices to correct these guesses. Further, just because a scan line crosses a vertical edge is a poor reason to guess that a vertex exists at this point. Accordingly, the number of interesting packer/unpacker combinations is small. Table 2 shows what any 'good' unpacker would have to guess at any point (or ? if either choice could be considered good), and the choices for two unpackers.

TABLE 1

| KNOWN DEPTHS | | | GUESSED UR DEPTH | | |
|---|---|---|---|---|---|
| LL | LR | UL | ANY UNPACKER | UNPACKER 1 | UNPACKER 2 |
| 0 | 0 | 0 | 0 | 0 | 0 |
| 0 | 0 | 1 | 1 | 1 | 1 |
| 0 | 1 | 0 | 1 | 1 | 1 |
| 0 | 1 | 1 | ? | 1 | 0 |
| 1 | 0 | 0 | ? | 0 | 1 |
| 1 | 0 | 1 | 0 | 0 | 0 |
| 1 | 1 | 0 | 0 | 0 | 0 |
| 1 | 1 | 1 | 1 | 1 | 1 |

KEY:
LL LOWER-LEFT QUADRANT
LR LOWER-RIGHT QUADRANT
UL UPPER-LEFT QUADRANT
UR UPPER-RIGHT QUADRANT

The difference is what to guess when the LR and UL depths are the same and the LL depth is different. In this case, a vertex must exist, and the guess only determines what kind of vertex it is. The assumption by unpacker 1 means it is a simple upper-right vertex (concave or convex, respectively for the two cases). The assumption of unpacker 2 implies it is a complex vertex. Because complex vertices are rare, and upper-right vertices make up roughly ¼ of the normal vertex mix, unpacker 1 was used in a preferred embodiment of the present invention. Unpacker 2 is the only one that allows unpacking backwards as well as forwards, and would have been preferably used to implement embodiments of the present invention which efficiently mirror in the Y direction.

Note that the packer has a very simple job. The packer just takes the incoming vertex queue and, based strictly on vertex type, either stores that or does not store the location of the vertex. For unpacker 1, the packer should store the location of every vertex except upper-right ones. For unpacker 2, the packer should store the location of every vertex except complex ones.

By utilizing the compressed data form in the present invention, a byte stream of the memory layout can be saved in a file. The memory layout may also be divided into manageable portions for memory allocation convenience. In one embodiment of the present invention, each scan line may start with a full X-Y position which is followed by a series of ΔX values with the end of the scan line being indicated by a ΔX value of zero. Each ΔX takes a variable number of bytes. For example, if the most significant bit of a byte is one, then the next byte should be expected to contain seven more bits of the value. Because most ΔX values are less than 128 and only three of four vertices are stored, this compressed form of data may store geometry in approximately ¾ bytes/vertex.

The compressed data format is most advantageously utilized when the data is to be processed multiple times. Any time a non-free on use geometry is accessed, the vertex queue must be copied. Only a compressed sorted vertex queue can be copied in this embodiment. Thereby, non-compressed queue types must be compressed before being copied. Copying a compressed queue is a relatively fast operation, but the term "copy" is somewhat of a misnomer. As previously mentioned, the memory layout is divided into manageable blocks, and each such memory block has a reference count. Such copying is advantageously used when all of the reference counts are incremented. When the unpacker operation finishes with a block, the reference count is decremented and the memory is freed if the reference count is zero. This allows the copying operation to be performed quickly. For mirroring operations in the Y direction, an unpacker operation may be used in conjunction with compressed forms of data.

Figure 12A:
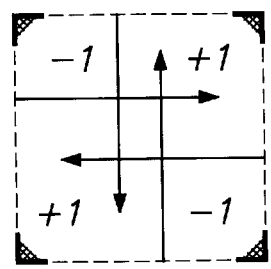
FIGS. 12(a)–12(f) illustrate comparisons between growing and shrinking operations in known vertex based systems and the vertex based geometry engine system according to embodiments of the present invention.
Figure 12B:
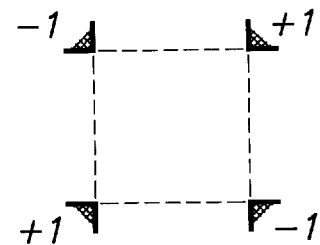
Figure 12C:
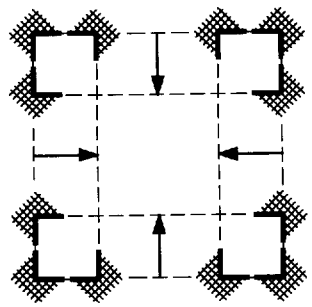
Figure 12D:
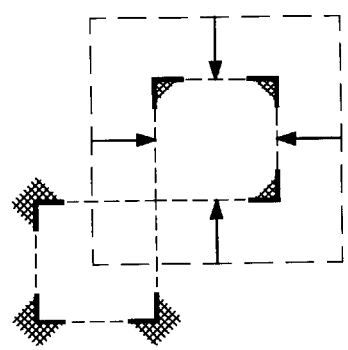
Figure 12E:
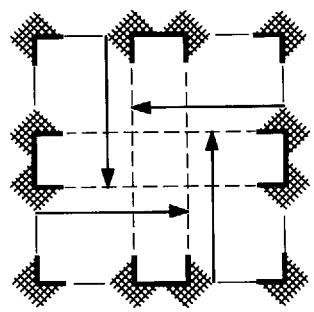
Figure 12F:
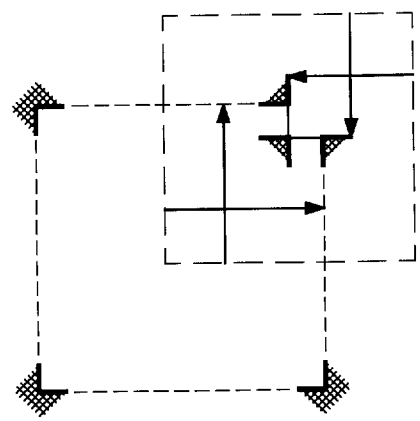

Another technique of the present invention is directed to problems arising from the Growing and Shrinking operations. When shrinking a small figure or growing a small hole out of existence, particular problems arise which distort the actual vertex type. These problems arise during the reduce function because only the depth Δ attributed to each vertex is considered and not the actual vertex type. Because diagonally opposite corners have the same depth Δ, if a geometric figure inverts in both axes, it comes back as illustrated in FIGS. 12(a) and 12(b). In the fang system, it is known to add synthetic vertices as illustrated in FIGS. 12(c) and 12(e). In contrast, the present invention only adds extra vertices to one corner type as illustrated in FIGS. 12(d) and 12(f). As a result, less vertex information is used so that the memory space needed and the processing time necessary for these operations are reduced.

Further speed improvements are achieved by the present invention from symmetric handling of depths less than zero and depths greater than one. More specifically, if the result of an And or Shrink operation is to be used in another And or Shrink operation, it is not necessary to reduce the result. In contrast, the fang system always reduces after And or Shrink operations, since voids that would otherwise result cannot be represented. As a result, processing time is saved. Also, a variant of the reduce operation is to interpret areas with odd depth as having geometry instead of only interpreting areas with depths greater than zero as having geometry. This allows exclusive OR operations to be implemented as basic operations. The geometry operands for exclusive Or operations must have no overlaps or voids for this function to operate properly.

The embodiments of the present invention are directed to a vertex based geometry engine which reduces the amount of memory used over known vertex based systems while increasing the speed. The reduction of memory space can be largely attributed to an incremental evaluation of the input data which frees the input data as it is used to compute results so that only small parts of intermediate results exist at any time. The reduced amount of memory space is also achieved by utilizing a compressed format for storing the geometry in less memory space. The vertex based geometry engine system of the present invention also improves the speed. The speed improvements can be largely attributed to the space saving improvements. Additional speed improvements are achieved from preventing the vertices from getting out of order as much as possible so that sorting operations are reduced. Also, reducing operations of the geometry are minimized while the creation of unnecessary vertices are eliminated during growing and shrinking operations which provides additional space and speed improvements.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for processing vertex based representations of geometry comprising the steps of:
    (a) inputting vertex based geometric data;
    (b) processing said vertex based geometric data in predetermined increments;
    (c) delivering the data processed at said step (b) to a vertex queue in sequence;
    (d) detecting whether vertices from a source of geometry are sorted; and
    (e) storing the vertices of said geometry in a sorted vertex queue when said step (d) detects that said geometry is sorted and storing the vertices of said geometry in an unsorted vertex list when said step (d) detects that said geometry is unsorted.

2. A method according to claim 1, further comprising the step of performing exclusive OR operations.

3. A method according to claim 1, wherein the field depth of the geometry at infinity is arbitrary so that true inverses of the geometry may be represented.

4. A system for processing vertex based representations of geometry comprising:
    means for inputting vertex based geometric data;
    a processor for processing said vertex based geometric data in predetermined increments and delivering the data to a vertex queue in sequence;
    a detector for detecting whether vertices from a source of geometry are sorted;
    a sorted vertex queue for storing the vertices of said geometry when said detector detects that said geometry is sorted; and
    an unsorted vertex list for storing the vertices of said geometry when said detector detects that said geometry is unsorted.

5. A system according to claim 4, wherein said processor performs exclusive OR operations.

6. A system according to claim 4, wherein the field depth of the geometry at infinity is arbitrary so that true inverses of the geometry may be represented.

7. A method for processing vertex based representations of geometry, comprising the steps of:
    (a) inputting vertex based geometric data to an unsorted vertex list;
    (b) detecting whether the vertex based geometric data input at said step (a) has reached a predetermined amount indicative of the capacity of said unsorted vertex list;

(c) sorting the vertex based geometric data in said unsorted vertex list after detecting that said predetermined amount has been reached at said step (b);

(d) storing the sorted vertex based geometric data at said step (c) in a sorted vertex queue; and (e) clearing said unsorted vertex list so that it is available to receive additional input vertex based geometric data.

8. A system for processing vertex based representations of geometry, comprising:

an unsorted vertex list for inputting vertex based geometric data thereto;

a detector for detecting whether the vertex based geometric data input to said unsorted vertex list has reached a predetermined amount indicative of the capacity of said unsorted vertex list;

means for sorting the vertex based geometric data in said unsorted vertex list after detecting that said predetermined amount has been reached;

a sorted vertex queue for storing the sorted vertex based geometric data; and means for clearing said unsorted vertex list so that it is available to receive additional input vertex based geometric data.

9. A method for sorting vertex based representations of geometry after scaling operations, comprising the steps of:

(a) detecting whether a scale factor of the scaling operation for vertices of a geometry is less than one;

(b) performing a sorting operation when said step (a) detects that the scale factor is less than one; and (c) preventing sorting operations from being performed when said step (a) detects that the scale factor is greater than or equal to one.

10. A method according to claim 9, wherein said step (b) performs said sorting operation on subsets of vertices that form a sorted scan line but include vertices from a plurality of original scan lines.

11. A system for sorting vertex based representations of geometry after scaling operations, comprising:

a detector for detecting whether a scale factor of the scaling operation for vertices of a geometry is less than one; and a processor for performing a sorting operation when said detector detects that the scale factor is less than one and preventing sorting operations from being performed when said detector detects that the scale factor is greater than or equal to one.

12. A system according to claim 11, wherein said processor performs said sorting operation on subsets of vertices that form a sorted scan line but include vertices from a plurality of original scan lines.

13. A method for sorting vertex based representations of geometry after Grow and Shrink operations, comprising the steps of:

(a) dividing vertices of the geometry into four sets based on the direction that each of the vertices has moved after the Grow and Shrink operations;

(b) performing merge/sort operations on first and second pairs of said four sets of vertices sorted at said step (a) which generates two sets of sorted vertices; and, (c) performing a merge/sort operation on the two sets of sorted vertices from said step (b) to generate one set of sorted vertices.

14. A system for sorting vertex based representations of geometry after Grow and Shrink operations, comprising:

dividing means for dividing vertices of the geometry into four sets based on the direction that each of the vertices has moved after the Grow and Shrink operations; and a processor for performing merge/sort operations on first and second pairs of said four sets of vertices to generate two sets of sorted vertices and performing a merge/sort operation on the two sets of sorted vertices to generate one set of sorted vertices.

15. A method for mirroring vertex based representations of geometry comprising the steps of:

(a) accumulating vertices of the geometry in each scan line; and, (b) reversing the vertices in each scan line for mirroring the geometry in the axis parallel to each scan line without sorting the vertices.

16. A system for mirroring vertex based representations of geometry comprising:

means for accumulating vertices of the geometry in each scan line; and mirroring means for reversing the vertices in each scan line for mirroring the geometry in the axis parallel to each scan line without sorting the vertices.

17. A method for mirroring vertex based representations of geometry, comprising the steps of:

(a) compressing and storing four corners of the geometry in an identical manner;

(b) explicitly storing the last vertex of each scan line similar to the first vertex; and (c) reading the byte stream of data backwards by an unpacker function to mirror the geometry in both the X- and Y-axis directions without sorting the vertices.

18. A system for mirroring vertex based representations of geometry, comprising:

means for compressing and storing four corners of the geometry in an identical manner and explicitly storing the last vertex of each scan line similar to the first vertex; and unpacking means for reading the byte stream of data backwards to mirror the geometry in both the X- and Y-axis directions without sorting the vertices.

19. A method for compressing data for vertex based representations of geometry, comprising the steps of:

(a) accessing a sorted vertex queue;

(b) storing the full X and Y values of the first vertex in each scan line of the geometry; and (c) storing only the incremental difference in the distance along each scan line between each of the remaining vertices in each scan line.

20. A system for compressing data for vertex based representations of geometry, comprising:

means for accessing a sorted vertex queue; and means for storing the full X and Y values of the first vertex in each scan line of the geometry and sorting only the incremental difference in the distance along each scan line between each of the remaining vertices in each scan line.

21. A method for unpacking compressed data for vertex based representations of geometry, comprising the steps of:

(a) accessing a sorted and reduced vertex list;

(b) determining whether geometry exists in three quadrants around a vertex from context; and (c) determining whether geometry exists in the remaining fourth quadrant of the vertex based on the presence or absence of the vertex in the vertex list such that the vertex type is not needed.

22. A system for unpacking compressed data for vertex based representations of geometry, comprising:

means for accessing a sorted and reduced vertex list; and a processor for determining whether geometry exists in three quadrants around a vertex from context and determining whether geometry exists in the remaining fourth quadrant of the vertex based on the presence or absence of the vertex in the vertex list such that the vertex type is not needed.

23. A method for processing vertex based representations of geometry comprising the steps of:

(a) performing a Grow or Shrink operation on a geometry; and (b) adding one set of synthetic vertices indicative of the change by the Grow or Shrink operation at only one corner type so that less vertex data is used to represent the geometry, wherein said one set of synthetic vertices comprises three vertices replacing a vertex in the original unprocessed geometry.

24. A system for processing vertex based representations of geometry comprising:

means for performing a Grow or Shrink operation on a geometry; and a processor for adding one set of synthetic vertices indicative of the change by the Grow or Shrink operation at only one corner type so that less vertex data is used to represent the geometry, wherein said one set of synthetic vertices comprises three vertices replacing a vertex in the original unprocessed geometry.

* * * * *